United States Patent [19]
Storer et al.

[11] Patent Number: 5,518,597
[45] Date of Patent: May 21, 1996

[54] CATHODIC ARC COATING APPARATUS AND METHOD

[75] Inventors: Jonathan G. Storer, Mendota Heights; Martin H. Benson, Shoreview; Robert R. Kieschke, Woodbury, all of Minn.

[73] Assignee: Minnesota Mining and Manufacturing Company, St. Paul, Minn.

[21] Appl. No.: 411,476

[22] Filed: Mar. 28, 1995

[51] Int. Cl.$^6$ .................................................. C23C 14/32
[52] U.S. Cl. .............................. 204/192.38; 204/298.41; 427/580
[58] Field of Search ..................... 204/192.38, 298.41; 427/580

[56] References Cited

U.S. PATENT DOCUMENTS

| | | | |
|---|---|---|---|
| 3,625,848 | 12/1971 | Snaper | 204/192.38 |
| 3,709,706 | 1/1973 | Sowman | 501/103 |
| 3,793,179 | 2/1974 | Sablev et al. | 204/298.41 |
| 3,836,451 | 9/1974 | Snaper | 204/298.41 |
| 4,090,941 | 5/1978 | Wright et al. | 204/298.06 |
| 4,166,147 | 8/1979 | Lange et al. | 428/328 |
| 4,219,397 | 8/1980 | Clarke | 204/192.12 |
| 4,221,652 | 9/1980 | Kuriyama | 204/298.22 |
| 4,243,505 | 1/1981 | Penfold | 204/298.16 |
| 4,252,626 | 2/1981 | Wright et al. | 204/192.15 |
| 4,370,539 | 1/1983 | Garlanov et al. | 219/121.57 |
| 4,386,258 | 5/1983 | Akashi et al. | 219/121.48 |
| 4,407,713 | 10/1983 | Zega | 204/298.22 |
| 4,430,184 | 2/1984 | Mularie | 204/192.38 |
| 4,452,686 | 6/1984 | Axenov et al. | 204/298.41 |

(List continued on next page.)

FOREIGN PATENT DOCUMENTS

| | | | |
|---|---|---|---|
| 63-18058 | 1/1988 | Japan | 204/298.41 |
| 1258301 | 12/1971 | United Kingdom . | |

OTHER PUBLICATIONS

H. K. Arcehor et al., Article in *Prib. I Tekhn. Ehksperimenta*, No. 5, pp. 236–237 (1978)—English Language Synopsis included.

D. B. Boercker et al., "Modeling Plasma flow in straight and curved solenoids", *J. Appl. Phys.*, 69, 115–120 (Jan. 1, 1991).

A. S. Gilmour, Jr., et al., "Pulsed Metallic–Plasma Generators", *Proceedings of the IEEE*, 60, 977–991 (Aug. 1972).

V. A. Osipov et al., "Unit for Depositing Coatings by Precipitation of Ions Extracted from a Vacuum–Arc Plasma", *Instruments & Experimental Techniques*, 21, 1650–1652 (1978).

D. M. Sanders, "Review of ion–based coating processes derived from the cathoidc arc", *J. Vac. Sci. Technol. A*, 7, 2339–23435 (May/Jun. 1989).

J. Storer et al., "Transport of vacuum arc plasma through straight and curved magnetic ducts", *J. Appl. Phys.*, 66, 5245–5250 (Dec. 1, 1989).

*Primary Examiner*—Aaron Weisstuch
*Attorney, Agent, or Firm*—Gary L. Griswold; Walter N. Kim; Leland D. Schultz

[57] ABSTRACT

A cathodic arc coating apparatus for applying a coating to an object is provided. The apparatus includes: an enclosure; means for evacuating the enclosure; an anode within the enclosure, wherein the anode comprises an open array of a metal defining a central axis and a deposition space for positioning the object; a cathode assembly positioned within the deposition space, wherein the cathode assembly comprises a first consumable cathode having a central axis and an evaporation surface; means for generating a plasma stream comprising charged particles, wherein the plasma stream is projected from the evaporation surface of the first consumable cathode toward the anode array; and a magnetic system for diverting the charged particles of the plasma stream away from the anode array and toward the object being coated; wherein the diverted charged particles are deposited on the object to form a coating thereon.

75 Claims, 5 Drawing Sheets

U.S. PATENT DOCUMENTS

| | | | |
|---|---|---|---|
| 4,492,845 | 1/1985 | Kijuchko et al. | 219/121.36 |
| 4,551,221 | 11/1985 | Axenov et al. | 204/298.41 |
| 4,563,262 | 1/1986 | Sablev et al. | 204/298.41 |
| 4,937,212 | 1/1990 | Funkenbusch et al. | 501/95 |
| 5,037,522 | 8/1991 | Vergason | 204/298.41 |
| 5,078,848 | 1/1992 | Anttila et al. | 204/192.38 |
| 5,258,164 | 11/1993 | Bloom et al. | 422/174 |
| 5,279,723 | 1/1994 | Falabella et al. | 204/192.38 |
| 5,282,944 | 2/1994 | Sanders et al. | 204/192.38 |
| 5,413,851 | 5/1995 | Storer | 428/361 |
| 5,433,836 | 7/1995 | Martin et al. | 204/298.41 |

CATHODIC ARC COATING APPARATUS AND METHOD

FIELD OF THE INVENTION

This invention relates to a cathodic arc coating method and apparatus useful for applying metal coatings, particularly metal oxides and other nonconductive metal coatings, to objects, particularly fibers or tows of fibers.

BACKGROUND OF THE INVENTION

Many chemical and physical vapor deposition methods are available to form coatings on substrates. For example, metals can be deposited by conventional evaporation or e-beam evaporation of a metal. Metal compounds (e.g., oxides, nitrides, and carbides) can be deposited by reactive chemical vapor deposition or reactive physical vapor deposition (e.g., sputtering). However, for chemical vapor deposition, it is particularly difficult to form certain metal oxides (e.g., yttrium oxide) because of the low vapor pressure of the starting materials (e.g., yttrium chloride). For reactive sputtering, it is particularly difficult to form certain metal oxides because of the formation of the oxide on the target metal.

Cathodic arc plasma deposition methods, also referred to as cathodic arc coating methods, produce generally uniform and dense coatings that are very hard and resistant to high temperatures. In cathodic arc coating, an arc, which is a discharge in a gas or vapor, is formed that is sustained by a highly ionized metal plasma produced by the erosion of the negative electrode (i.e., the cathode). Typically, the arc is active for a short period of time, momentarily extinguishes, and then reforms in a new location. This gives the appearance of the arc moving rapidly over a cathode surface. The resultant ebullition of the cathode material forms electrons, ions, macroparticles, and neutral vapor species. In reactive cathodic arc coating, a reactive gas (i.e., a process gas such as oxygen or nitrogen), is admitted into the coating chamber and an oxide or nitride is then deposited on the substrate. Typically, coatings formed from a cathodic arc method are generally dense reflective films having a small crystallite size (generally about 50–150 nm).

One problem encountered in cathodic arc coating methods results from the production of macroparticles in the plasma stream. Macropoarticles are large droplets (approximately 0.1–10 μm) and solid fragments of the cathode material. These macroparticles produce undesirable flaws in the coating, particularly when coated on small diameter fibers. To prevent this, a combination of perpendicular magnetic and electric fields can be used to control the path of the plasma stream. The charged particles are directed toward the material to be coated and the macroparticles are allowed to continue on a line-of-sight path.

One means by which this is done is described in Kljuchko et al. U.S. Pat. No. 4,492,845. This patent describes a plasma arc apparatus comprising a working anode chamber in the form of a solid pipe of a nonmagnetic metal, and a consumable cathode provided with an opening for an object to be coated to be installed therein, wherein the cathode has a cross-sectional configuration that coincides with that of the anode pipe. The cathode is disposed within the anode in an axial relation so that the lateral surface of the cathode faces the anode and functions as an evaporation surface. A magnetic system for deviating ions of the plasma produced by the arc in the direction of the object to be coated is mounted on the outer side of the anode. In sum, the cathode surface, from which the vapor and macroparticles are formed, is placed out of the line-of-sight of the object to be coated. The magnetic field and its concomitant electric field turn a substantial fraction of the vapor toward the object to be coated, and the macroparticles fly off in a harmless direction. However, the fraction of the vapor that is not turned toward the object lands on the anode. This is undesirable because some of the macroparticles can be deflected back toward the object being coated. If an electrically insulating material (e.g., a metal oxide) is coated on the object, it will also coat the anode, thereby shielding the anode from the electrical current required to sustain the process. The system then shuts down. Typically, this occurs after less than about 10 minutes of operation. Because an important class of coatings are electrically insulating, this apparatus cannot be efficiently used for applying such coatings. Thus, a need exists for an apparatus capable of coating electrically insulating materials, as well as other materials, using cathodic arc methods.

SUMMARY OF THE INVENTION

The cathodic arc apparatus and method of this invention allows for the production of generally uniform and dense coatings. The apparatus and method of the present invention can be used to coat any article desired; however, they are particularly desirable for coating fibrous materials. Any coating material, such as metals and oxides, carbides, or nitrides of metals, can be applied using the apparatus and method of the present invention. The greatest benefit to using this apparatus and method is the deposition of nonconductive coatings, such as metal oxides, onto fine diameter fibers. Preferably, the metal oxide is a rare-earth oxide, such as yttrium oxide. Nonconductive coatings, such as oxides, are of considerable interest because of their utility as barrier coatings on ceramic fibers incorporated into metal matrices.

One embodiment of the present invention is a cathodic arc coating apparatus for applying a coating to an object, comprising: an enclosure; means for evacuating the enclosure; an anode within the enclosure, wherein the anode comprises an open array of a metal defining a central axis and a deposition space for positioning the object; a cathode assembly positioned within the deposition space, wherein the cathode assembly comprises a first consumable cathode having a central axis and an evaporation surface; means for generating a plasma stream comprising charged particles, wherein the plasma stream is projected from the evaporation surface of the first consumable cathode toward the anode array; and a magnetic system for diverting the charged particles of the plasma stream away from the anode array and toward the object being coated; wherein the diverted charged particles are deposited on the object to form a coating thereon.

A second embodiment of the present invention is a cathodic arc coating apparatus for applying a coating to an object, comprising: an enclosure; means for evacuating the enclosure; an anode within the enclosure, wherein the anode comprises an open array of a concentrically arranged metal wires defining a central axis and a deposition space for positioning the object; a cathode assembly positioned within the deposition space, wherein the cathode assembly comprises a first ring-shaped consumable cathode having a central axis, a top surface, a bottom surface, and a circumferential evaporation surface, and the central axes of the anode array and the first consumable cathode are coaxially aligned such that the evaporation surface of the first consumable cathode is outwardly facing with respect to its central axis; means for generating a plasma stream comprising charged particles, wherein the plasma stream is projected from the evaporation surface of the first consumable cathode toward the anode array; and a magnetic system for diverting the charged particles of the plasma stream away from the anode array and toward the object being coated, wherein the magnetic system comprises a magnetic field generator, a power source, and a magnetic field comprising lines of flux extending into the deposition space generated by the power source and magnetic field generator; wherein the diverted charged particles are deposited on the object to form a coating thereon.

A third embodiment of the present invention is a cathodic arc coating apparatus for applying a coating to an object comprising: an enclosure; means for evacuating the enclosure; an anode, wherein the anode has a central axis and defines a deposition space for positioning the object; a cathode assembly positioned within the deposition space, wherein the cathode assembly comprises a first ring-shaped consumable cathode having a central axis, a top surface, a bottom surface, and a circumferentially crenelated evaporation surface; means for generating a plasma stream comprising charged particles, wherein the plasma stream is projected from the evaporation surface of the first consumable cathode toward the anode array; and a magnetic system for diverting the charged particles of the plasma stream away from the anode array and toward the object being coated; wherein the diverted charged particles are deposited on the object to form a coating thereon.

A fourth embodiment of the present invention is a cathodic arc coating apparatus for applying a coating to an object,comprising: an enclosure; means for evacuating the enclosure; an anode, wherein the anode has a central axis and defines a deposition space for positioning the object; a cathode assembly positioned within the deposition space, wherein the cathode assembly comprises a first consumable cathode having a central axis and an evaporation surface; means for generating a plasma stream comprising charged particles, wherein the plasma stream is projected from the evaporation surface of the first consumable cathode toward the anode array; and a magnetic system for diverting the charged particles of the plasma stream away from the anode array and toward the object being coated; wherein the magnetic system comprises a magnetic field generator comprising pinch coils for generating a magnetic field comprising lines of flux extending into the deposition space; wherein the diverted charged particles are deposited on the object to form a coating thereon.

A fifth embodiment of the present invention is an anode for use in a cathodic arc coating apparatus, comprising an open array of a metal defining a central axis and a deposition space for positioning of an object.

A sixth embodiment of the present invention is a ring-shaped consumable cathode for use in a cathodic arc coating apparatus, comprising a central axis, a top surface, a bottom surface, and a circumferentially crenelated evaporation surface.

A seventh embodiment of the present invention is a method for coating fibers, comprising: providing a cathodic arc coating apparatus; heating the anode array; advancing fibers through the central opening of the cathode; generating a plasma stream comprising charged particles and directing it from the evaporation surface of the first consumable cathode toward the anode array; generating a magnetic field for diverting the charged particles of the plasma stream away from the anode array and toward the object being coated; and contacting the fibers with the diverted charged particles to form a coating thereon. For this method, the cathodic arc coating apparatus comprises: an enclosure; means for evacuating the enclosure; an anode within the enclosure, wherein the anode comprises an open array of a metal defining a central axis and a deposition space for positioning the object; a cathode assembly positioned within the deposition space, wherein the cathode assembly comprises a first consumable cathode having a central axis and an evaporation surface; means for generating a plasma stream comprising charged particles; and a magnetic system.

DETAILED DESCRIPTION OF THE INVENTION

Figure 1:
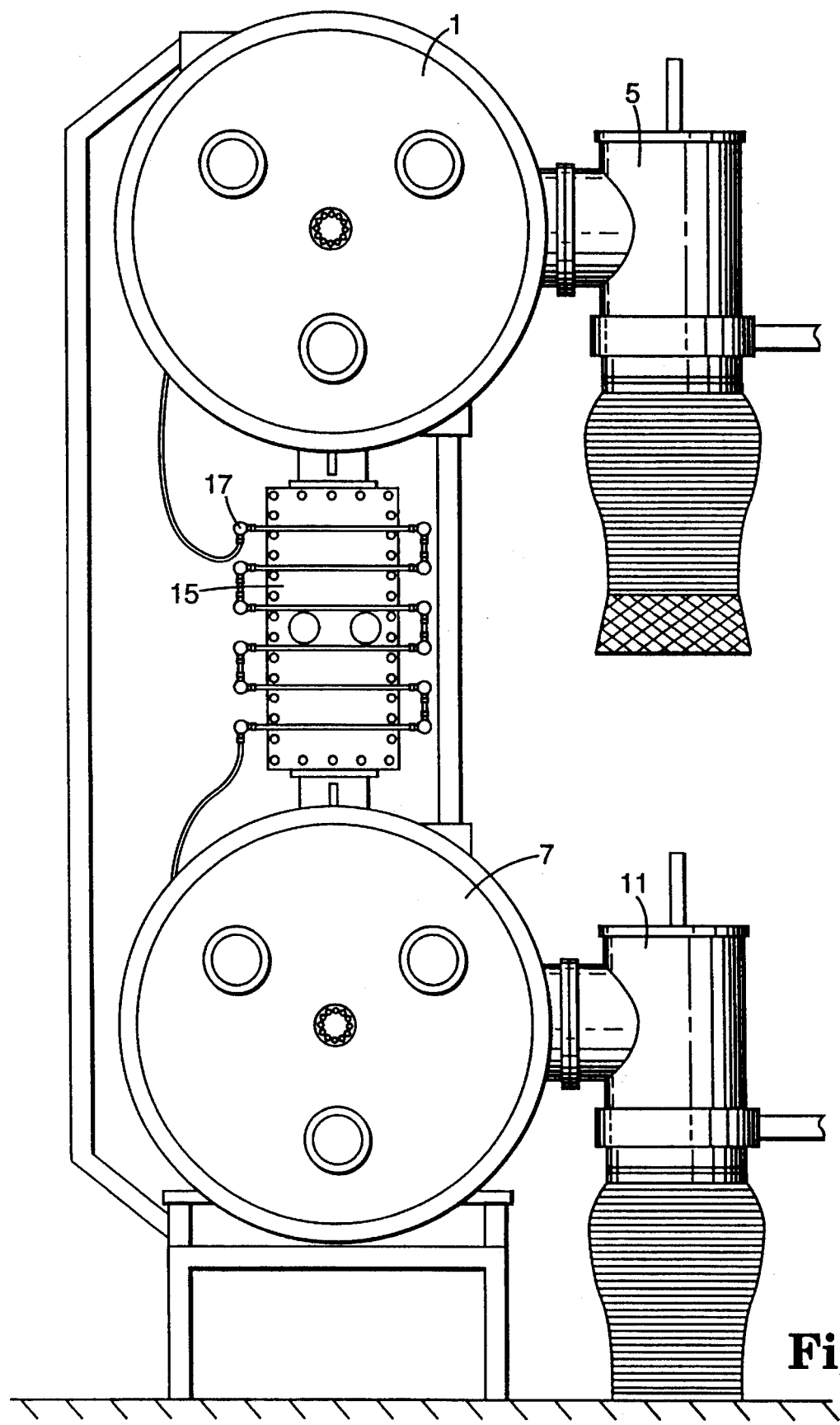
FIG. 1 is a front view of a cathodic arc coating apparatus for applying coatings according to the present invention.

The present invention provides a cathodic arc coating apparatus for applying metal coatings, preferably metal oxides and other nonconductive metal coatings, to objects, preferably fibers or multifilament tows of fibers. The apparatus includes a metal ion reactor placed in an evacuated reaction chamber, i.e., an enclosure. The metal ion reactor includes an anode and a cathode assembly. The anode has a central axis and defines a deposition space for positioning the object. The cathode assembly can include one or more consumable cathodes, each having a central axis and an evaporation surface. The consumable cathodes are positioned within the deposition space. Preferably, the anode is in the form of an open array of a metal, e.g., wires, which can be heated during operation for further advantage. Preferably, the cathode is positioned within the deposition space of the anode such that the central axes of the anode and the cathode are operationally aligned and the surface from which the coating material is obtained, i.e., the evaporation surface of the cathode, is outwardly facing with respect to its central axis. More preferably, each cathode is ring-shaped with a central opening in which an object to be coated can be positioned or transported through. Although each consumable cathode can have a cross-sectional configuration substantially the same as that of the anode and an axial length that is typically less than the axial length of the anode, these are not necessary requirements. In particularly preferred embodiments, the evaporation surface of the cathode comprises a crenelated or slotted surface for more efficient use of the cathode material or as a means of promoting uniform erosion of the cathode.

The apparatus can also include: means for evacuating the enclosure; means for generating a plasma stream comprising charged particles, which can also include macroparticles; and a magnetic system for diverting the charged particles of the plasma stream, which is projected from the evaporation surface of the cathode toward the anode, away from the anode and toward the object being coated. Certain preferred embodiments of the apparatus of the invention include means for heating the anode to attenuate the accumulation of material from the plasma stream on the anode; means for conveying the object parallel to the central axis of the cathode through the deposition space so as to progressively coat the exterior of the object; and means for injecting a process gas into the deposition space.

The magnetic system is mounted on the outside of the anode and can be in any of a variety of configurations. Preferably and advantageously, the magnetic system comprises a magnetic field generator, preferably a solenoid, a power source, and a magnetic field generated by the power source and magnetic field generator, wherein the magnetic field comprises lines of flux extending into the deposition space. More preferably, the solenoid includes a main coil having an open configuration. Most preferably, the magnetic field generator includes pinch coils at the ends of the main coil to create a magnetic bottle effect for further confining the plasma. The magnetic field generator can be mounted inside the enclosure, outside the enclosure, or it can be the enclosure itself.

In all embodiments of the cathodic arc coating apparatus of the present invention, the cathode evaporation surface, from which the plasma stream is projected, is placed out of the line-of-sight of the object to be coated. The magnetic field and its concomitant electric field turn a substantial fraction of the plasma stream toward the object to be coated, and the macroparticles fly off in a harmless direction. In certain preferred embodiments, a substantial amount of the fraction of the plasma stream that is not turned toward the object to be coated passes out through the open anode array. This includes the macroparticles. Because the anode array is heated, which is preferred when a nonconductive coating is being produced, that portion of the plasma stream that lands on the anode array is not as detrimental to the generation of the plasma as when the anode array is not heated. That is, as a result of heating the anode array during the deposition of a nonconductive coating, the apparatus can run for hours (or until the cathode material is consumed), as opposed to only about 7–10 minutes, before the arc permanently extinguishes. It will be understood by one of skill in the art that it is desirable to place the anode and the cathode a sufficient distance apart to reduce the deposition of macroparticles on the anode array itself, while at the same time it is desirable to place them dose together to provide as strong an electric field as possible to deflect the charged particles of the plasma stream to the object being coated.

Any non-ferromagnetic metal can be used as the cathode in the apparatus of the present invention. A nonconductive coating could then be formed by admitting a process gas such as oxygen into the evacuated enclosure. Although the apparatus and method of the present invention are particularly useful for the application of a nonconductive coating, conductive coatings can also be applied. For example, if the process gas is nitrogen or methane, conductive nitrides and carbides can be produced. The process gas reacts with the atoms and ions in the plasma stream to form a metal compound that deposits on the object to be coated. Metals or metal-based materials useful as the coatings in the present invention include, for example, molybdenum, tantalum, tungsten, and niobium; oxides of aluminum, yttrium, zirconium, hafnium, gadolinium, titanium, erbium, and other rare earth metals; and carbides of tantalum, tungsten, niobium, zirconium, hafnium, and titanium. Nitrides or borides of such metals can also be formed. The selection of the metal or metal compound will be dependent upon the final desired use of the coated object. For example, yttria ($Y_2O_3$) is particularly desirable as a barrier layer on fibers used in titanium matrices. Preferably, the metal or metal compound is applied to achieve a coating thickness of about 20–500 nanometers, more preferably, about 50–300 nanometers.

A preferred embodiment of the cathodic arc coating apparatus of the present invention is shown in FIG. 1. This particular embodiment is designed for coating fibers or multifilament tows of fibers with a metal coating, particularly a nonconductive metal coating such as a metal oxide coating. This apparatus includes an upper chamber 1, which is connected to a first high vacuum pump 5, and a lower chamber 7, which is connected to a second high vacuum pump 11. Preferably, the high vacuum pumps 5 and 11 are diffusion pumps. Positioned between the two chambers is a reaction chamber 15 and a cooling system 17. The high vacuum pumps 5 and 11 are used for evacuating the enclosure which defines the upper chamber 1, the lower chamber 7, and the reaction chamber 15. Inside the reaction chamber of this particular embodiment is a metal ion reactor comprising an anode, a cathode, means for generating a plasma stream, and a magnetic system (not shown). Various embodiments of this reactor and its components are shown in more detail in FIGS. 2–5. Referring to FIG. 6, which shows an internal view of the three chambers shown in FIG. 1, the upper chamber 1 contains fibers 19 on pay-out spools 21. The fibers are directed from the upper chamber 1 through the reaction chamber 15 for coating by means for advancing the fibers (not shown) and into the lower chamber 7, wherein the coated fibers 23 are wound onto take-up spools 25.

Figure 2:
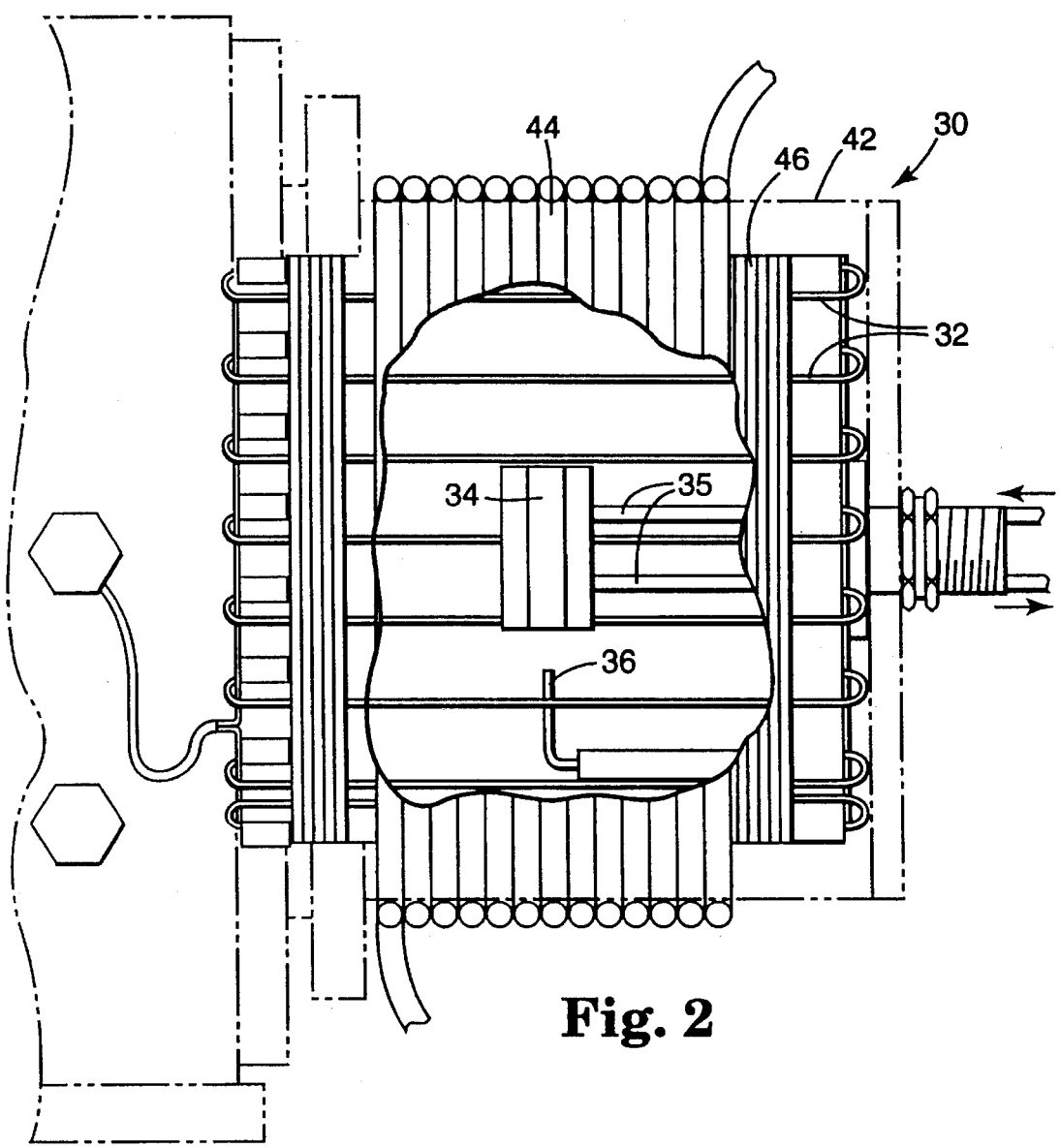
FIG. 2 is a side view of one embodiment of a reactor for a cathodic arc coating apparatus of the present invention.

An embodiment of a cathodic arc coating apparatus in which the magnetic field generator of the magnetic system is outside the reaction chamber is shown in FIG. 2 (side view with cut-away portion to show the cathode in the center of the anode array). In this embodiment, a cathodic arc coating apparatus 30 includes an anode comprising an array of wires 32 (referred to herein simply as the anode or anode array), a consumable cathode 34, a striker 36 (often referred to as a starting electrode), which is electrically connected to the anode array 32 and brought into contact with the cathode 34 very briefly to establish an arc on the cathode 34. The arc is sustained by the plasma between the cathode 34 and the anode 32. Typically, the striker is made of a refractory metal. Also, in the apparatus shown in FIG. 2 is an enclosure 42 that forms the reaction chamber (represented by dashed line). The enclosure 42 is made of a nonmagnetic metal, such as aluminum or stainless steel, which surrounds the anode array 32 and the cathode 34, and can be in any desired configuration. Typically, the enclosure 42 is made of stainless steel and is in the form of a tube having a circular cross-sectional configuration.

Surrounding enclosure 42 is a magnetic system comprising a magnetic field generator 44 in the form of a coiled metal tube, preferably a copper tube, arranged in a closed configuration, i.e., the turns of the coil are tightly wound into a compressed configuration. Although it may be more convenient to have the magnetic coil inside the enclosure, i.e., reaction chamber, it can be advantageous to have it outside to reduce the number of macroparticles deflecting back toward the object being coated. In this configuration, as compared to a similar configuration in which the magnetic coil is inside the enclosure, the power must be higher to the magnetic coil to create the same magnetic field inside the enclosure.

Still referring to FIG. 2, inside enclosure 42 and surrounding the anode array 32 is a deflector 46. The deflector 46 is made of a nonmagnetic metal, such as aluminum or stainless steel, in the form of a series of thin rings of metal plate arranged with openings between the rings. This can have a finned configuration, as in a radiator. The deflector 46 is used for catching macroparticles and preventing them from bouncing off the surface of enclosure 42 and back toward the anode and object being coated. Although this deflector provides advantage to certain embodiments of the invention, preferred embodiments of the invention do not include it.

Figure 3:
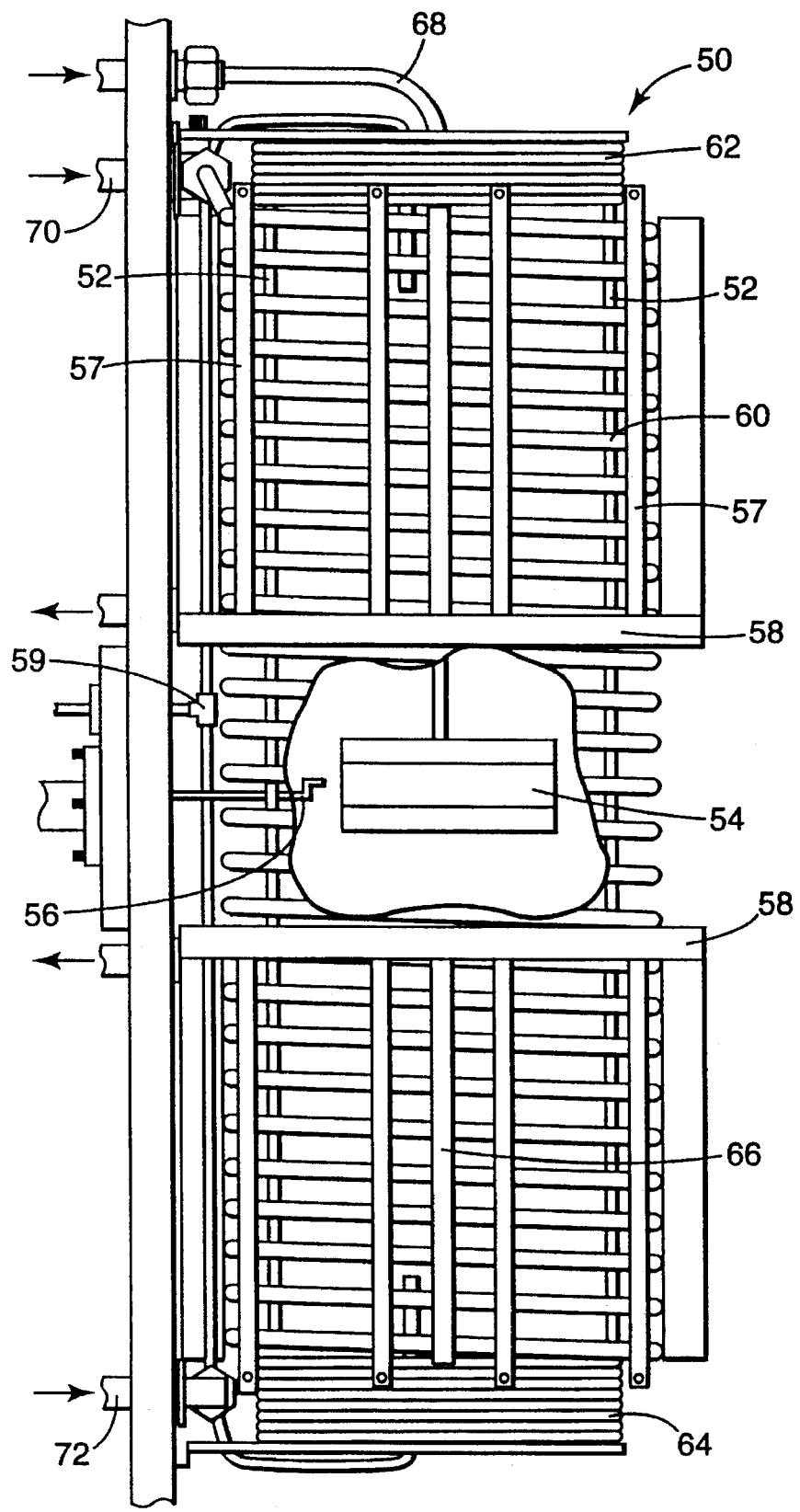
FIG. 3 is a side view of an alternative embodiment of a reactor for a cathodic arc coating apparatus of the present invention.

Referring to FIG. 3, an alternative and preferred embodiment of the interior of the reaction chamber 15 (FIG. 1) for a cathodic arc coating apparatus of the present invention is shown (side view with cut-away portion to show the cathode in the center of the anode array). Similar to the embodiment shown in FIG. 2, the reactor 50 includes an anode comprising an array of wires 52, a consumable cathode 54, and a striker 56. Shown also in FIG. 3 is an anode wire support system, which includes support bars 57, support rings 58, and slip connectors (not shown), and a process gas injector 59 for injecting an inert gas and/or a process gas (e.g., oxygen, nitrogen, or methane) into the reaction chamber.

In FIG. 3, surrounding the array of anode wires 52 is a magnetic field generator in the form of a solenoid comprising a main coil 60 arranged in an open configuration, i.e., the turns of the coil are loosely wound forming gaps between the individual turns. At the ends of the main coil are pinch coils 62 and 64 for setting up a second magnetic field of a different strength. The pinch coils are positioned such that they do not allow the plasma to escape from the space between the main coil and the pinch coils. The pinch coils have a cross-sectional diameter that is equal to or less than the cross-sectional diameter of the main coil. They create a magnetic bottle effect that confines the plasma, thereby increasing the efficiency of the system. Shown also in FIG. 3 is a magnetic system support member 66, current tubes 68 for providing power to the cathode, current tubes 70 for providing power to the anode, and means for providing power to the magnetic system 72.

Figure 4:
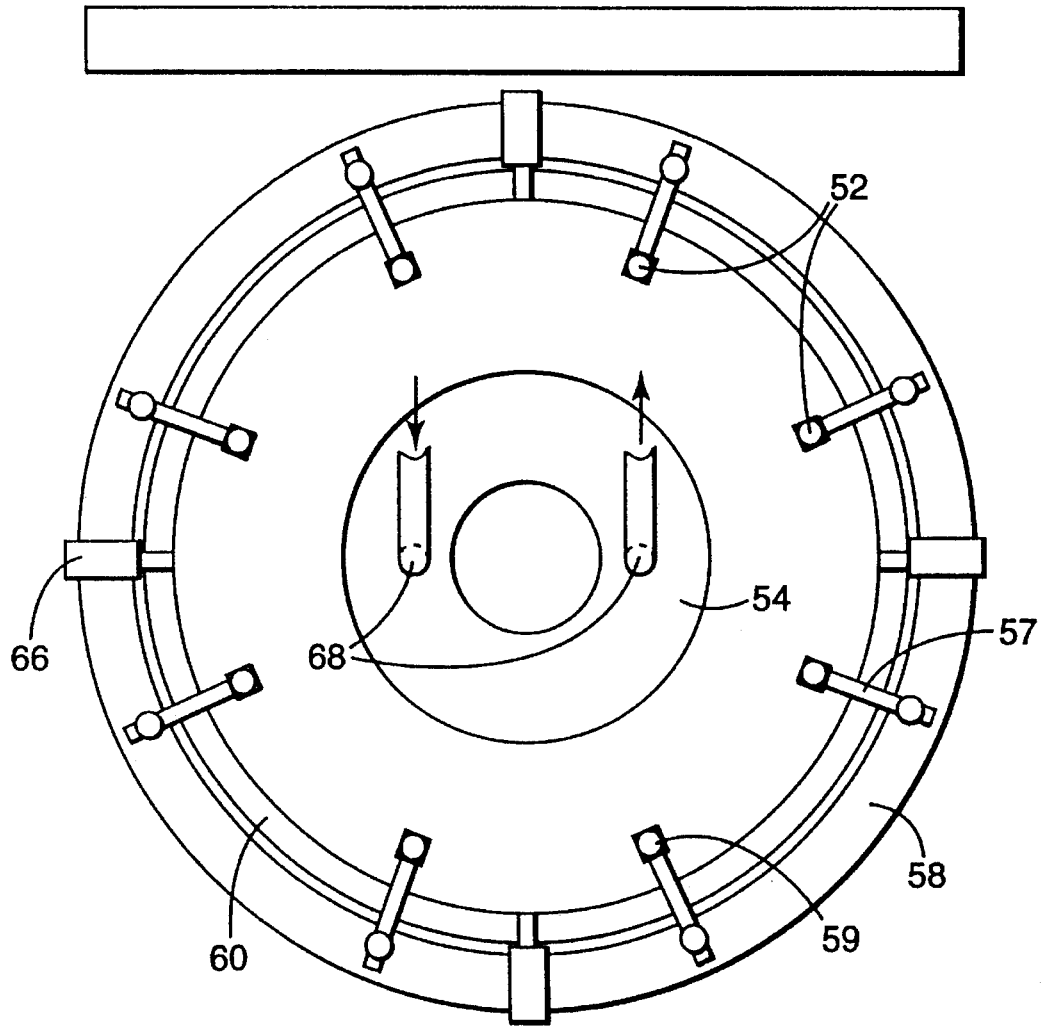
FIG. 4 is a top view of the reactor shown in FIG. 3.

FIG. 4 is a top view of the embodiment shown in FIG. 3 showing the tops of the anode wires 52, anode wire support system comprising support bars 57, support rings 58, and slip connectors 59, cathode 54, current tubes 68, magnetic coil 60 (pinch coil 62 not shown), and magnetic system support member 66. The anode wire support system includes slip connectors 59 through which the upper ends of the anode wires pass. These slip connectors allow the wires to expand in length upon heating without substantially bending or distorting the wires. This also helps prevent the system from shorting. In this embodiment, the lower ends of the anode wires are positioned in cups and held in place by gravity, although they could be held in place by a variety of mechanisms, such as welding, for example. Thus, the anode wires are supported at a first end and slidingly engaged with the slip connectors at a second end. Although in this embodiment, the anode wires are positioned upright, i.e., vertically, it will be understood by one of skill in the art that this support system could be used for anode wires that are positioned horizontally as well. The support system of the apparatus can be made of any nonmagnetic metal, preferably copper. To avoid undesired overheating of components, it is advisable to cool the support rings of the anode wire support system with a coolant such as water, by using hollow support rings.

In either of the embodiments shown in FIGS. 2 or 3 and 4, the anode comprises an array of wires made of a conductive material, preferably a metal, although the anode array does not have to be in the form of wires. Typically, the metal is nonmagnetic, at least during operation when it is heated. Preferably, the metal is a refractory metal. As used herein, a "refractory" metal is one that has a melting temperature above about 1200° C., preferably above about 2000° C. During use, the anode is heated to a temperature of about 800°–1200° C., preferably to a temperature of about 1200° C. Typically, this occurs by resistively heating the metal, although an additional contribution to the heating is due to electron bombardment during the coating process. As stated previously, heating the anode attenuates the accumulation of material thereon from the plasma stream. Means for heating, preferably resistively heating, the anode to the desired temperature will be known by one of skill in the art.

The type of metal for the anode is chosen so that it can be heated to the desired temperature during use without substantially sagging or deforming although a certain amount of expansion is allowed, particularly if the anode array comprises wires and the slip connectors discussed above are used. Suitable metals for the anode include, but are not limited to stainless steel, tungsten, molybdenum, tantalum, niobium, rhenium, iridium, osmium, and ruthenium. Typically, tungsten is preferred. Preferably, the anode metal is of a commercial grade, e.g., greater than about 99% pure.

As stated above, the anode does not have to be in the form of an open array of metal for all embodiments of the present invention. For example, in embodiments utilizing a crenelated cathode or a magnetic system including pinch coils, the anode can be in the form of a solid hollow tube, as disclosed in Kljuchko et al. U.S. Pat. No. 4,492,845. In such an embodiment, the anode can be the enclosure described herein. Preferably, however, the anode is an open array of a metal defining a central axis and a deposition space for positioning an object, for particular advantage. For example, the anode array can comprise wires, perforated metal, chicken wire, or an expanded metal sheet of the type disclosed in U.S. Pat. No. 5,258,164. Preferably, whether in the form of wires, an expanded metal sheet, or the like, the metal members of the anode array occupy less than about 50% of the projected area of the anode array, the remainder being the open space between the metal members. More preferably, the metal members occupy less than about 5% of the projected area of the anode array, and most preferably less than about 1% of the projected area of the anode array. This open space substantially reduces the deflection of macroparticles from the anode back toward the object being coated.

If used, the anode wires, i.e., rods, can be of a wide variety of shapes. They can be round, square, or triangular in cross-section. They can also be in the form of hollow tubes. To minimize the undesirable deflection of macroparticles back toward the object being coated, it is preferred that these wires have a circular cross-section. The cross-sectional size of the wires is chosen so that they can be heated to the desired temperature during use without substantially sagging or deforming. Typically, the smaller the diameter of the wires, the hotter they get during operation. If the wires are circular in cross-section, the diameter is preferably about 0.062–0.250 inch (0.157–0.635 cm), although monofilament wire could also be used (0.010 inch in diameter).

The anode array, preferably in the form of wires, is preferably concentrically arranged and axially aligned. Although the cross-section of this arrangement is preferably circular, it can also be oval, rectangular, square, or polyhedral. The shape of the anode array is not critically limiting, although it is preferred that the anode and cathode have similar cross-sectional shapes for symmetric deposition of the coating material. A circular arrangement is preferred at least because it causes the plasma to rotate around the object to be coated.

For the preferred anode array, a sufficient number of wires are used to set up an electric field and direct the charged particles to the object to be coated. It is generally desirable to use as few wires as possible to provide as open an array as possible; however, the greater the number of wires, the greater the steering capacity of the wires and the more uniform the deposited coating. Depending on the size of the anode array, the desired strength of the electric field to be generated, and the desired amount of current to be applied, a wide number of anode wires can be used. Preferably, these anode wires are axially aligned and spaced generally equidistant in a circular cross-sectional array. More preferably, the anode wires are spaced equidistant from each other and from the cathode. Typically, the size of the array, e.g., the cross-sectional diameter of the tube defined by the array of wires, and the axial length of the wires are limited only by practical considerations, such as the size of the reaction chamber, which is typically controlled by the size of the building in which it is located.

In either of the embodiments shown in FIGS. 2 or 3 and 4, the cathode is installed within the array of anode wires with the aid of two current tubes, i.e., legs (35 in FIG. 2, 68 in FIGS. 3 and 4). Although a direct current source can be connected to the anode and one of the tubes and a pulsed current source to the other tube and the striker (36 in FIG. 2, 56 in FIG. 3), preferably both are direct current sources. Typically, this can be accomplished using one direct current source and connecting the positive terminal to the anode support ring, which feeds the anode support bars and subsequently the anode wires, and the striker, and connecting the cathode to the negative terminal through one of the current tubes, i.e., legs. The circuit is completed during operation through the plasma between the cathode and anode. Preferably, the direct current is about 50–250 Amps, and more preferably about 200 Amps. To improve the operation of the cathode, it is advisable to cool it with a coolant such as water, for example. This can be done by using hollow current tubes and passing the water through these tubes (water supply and withdrawal are shown by arrows in FIG. 4).

It will be understood by one of skill in the art that various electrical configurations can be used. For example, if two cathodes are used, two separate electrical supplies can be used so the cathodes can run simultaneously with a common anode. Alternatively, one supply can be used and the cathodes run nonsimultaneously by pulsing them, as is disclosed in Kljuchko et al. U.S. Pat. No. 4,492,845. In yet another embodiment, two entirely electrically separate systems can be set up by connecting certain of the anode wires to one cathode, and the remaining wires to a second cathode.

The cathode is preferably in the form of a ring with an opening in which the object to be coated is positioned, or transported through in the case of fibers, and an evaporation surface. Although a ring-shaped cathode is preferred, the cathode can be in a variety of shapes and in a number of pieces. For example, the cathode can be a thin ring or a series of thin rings, which can be separated by spacers, or it can be in the shape of a helix. The evaporation surface can be any surface of the cathode that is not in line-of-sight with the object to be coated. The cathode, or at least the evaporation surface of the cathode, can include any metal desired. Examples of cathode materials include molybdenum, tantalum, tungsten, niobium, aluminum, yttrium, zirconium, hafnium, gadolinium, titanium, erbium, copper, and chromium.

Figure 5:
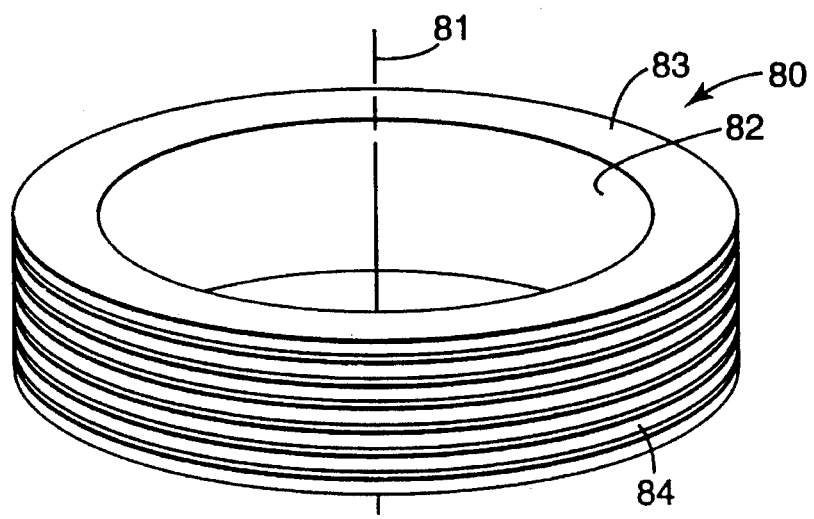
FIG. 5 is a preferred ring-shaped cathode.
Figure 6:
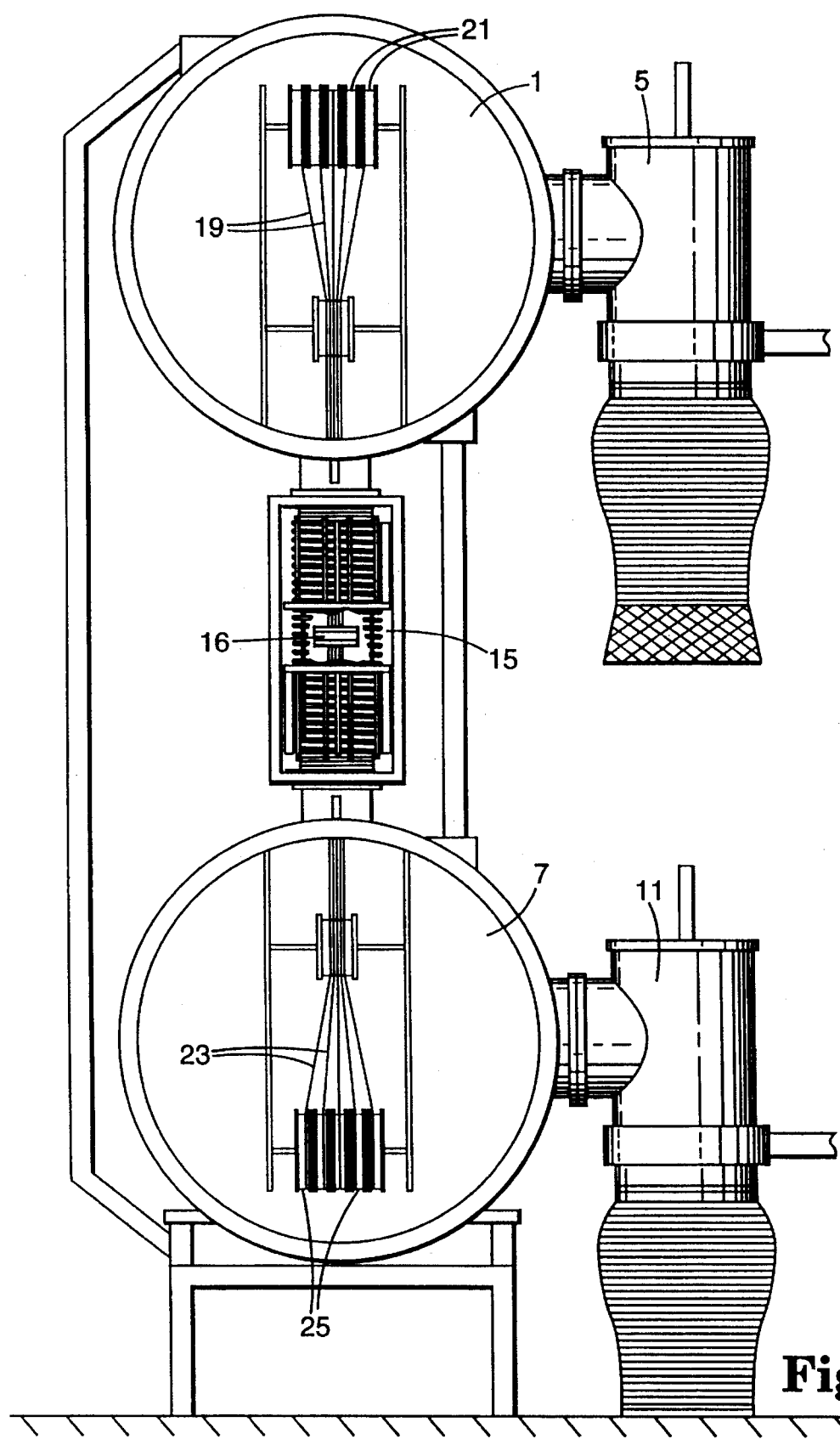
FIG. 6 is an internal view of the three chambers shown in the apparatus of FIG. 1.

Referring to FIG. 5, a particularly preferred ring-shaped cathode 80 is shown having a central axis 81, a central opening 82, a top surface 83, a bottom surface (not shown), and a concentric evaporation surface 84 from which the plasma is generated. This evaporation surface is preferably circumferentially crenelated, i.e., slotted, to facilitate rastering of the arc evenly across the surface of the cathode, although it will be understood by one of skill in the art that crenelations are not required for all embodiments of the present invention. Crenelations are preferred, however, because they result in more even wear and more effective use of the cathode material. The height of this surface is preferably less than the axial length of the anode wires. Preferably, the height of the evaporation surface of the cathode is about 0.03–0.1 times the axial length of the anode wires. Typically, the smaller the height of this evaporation surface the better the plasma steering capability of the apparatus. The distance between the slots provides distinct surfaces from which the arc can produce a plasma. These surfaces should not be so large that the arc can cup and groove each surface and extinguish the arc. Furthermore, the width of the slots should not be so large that the arc can get down inside the slot and extinguish. Preferably, the slots are about 0.10–0.15 inch apart and about 0.050 inch wide, however they can be as deep as desired.

The cathodic arc coating apparatus of the present invention can include more than one axially spaced cathode each with a central axis positioned in a coaxial relationship within the anode array. If the cathodes are each of a different metal, mixed metal coatings, e.g., mixed metal oxide coatings such as $Y_2O_3$—$Al_2O_3$ or $ZrO_2$—$Y_2O_3$, can be deposited. If multiple cathodes are used, they can be electrically insulated, each having an associated striker and separate current tubes with a common anode. Alternatively, they can be electrically connected using common current tubes. They are preferably axially spaced for optimum deposition with substantially no unwanted deposition on nearby cathodes. For depositing a mixed metal oxide coating, it is also possible to use a composite cathode, i.e., one cathode containing distinct regions of at least two different metals.

In preferred embodiments, all surfaces that can sustain the arc are insulated to prevent arc migration around the reaction chamber. For example, the cathode evaporation surface is preferably surrounded by a confinement ring made of an insulating material, such as ceramic, fiberglass, or boron nitride, for example, to confine the arc to the surface of the cathode. Confinement rings such as this are disclosed in Mularie U.S. Pat. No. 4,430,184. Thus, the cathode can include an insulating material on its top and bottom surfaces and the current tubes, i.e., cathode legs, can also be wrapped with insulating material.

As shown in FIGS. 2 and 3, the cathodic arc apparatus of the present invention includes a magnetic system comprising a magnetic field generator, a power source, and a magnetic field comprising lines of flux extending into the deposition space defined by the anode. Preferably, these lines of flux do not intersect the anode, so as to magnetically insulate the cathode from the anode. This increases the electrical potential drop between the cathode and the anode and improves the streering of the ions (e.g. charged particles) to the object. The magnetic field generator can comprise a solenoid in the form of an open or dosed main coil (44 in FIG. 2, 60 in FIG. 3) mounted on the outer side of the array of anode wires. In FIG. 2, it is also mourned outside the enclosure 42 and the deflector 46, both of which are preferably nonmagnetic. It will be understood by one of skill in the art that the magnetic field generator can be the enclosure itself as well.

The magnetic system is intended for producing a unidirectional magnetic field within the anode array to aid in directing charged particles of plasma from the evaporation surface of the cathode, away from the anode, and back toward the object to be coated. It will be understood that the magnetic field generator can have configurations other than a coil, although the coil is preferred, and the open coil configuration is more preferred. Typically, the length of the magnetic field generator, preferably in a coiled configuration, is as long as the axial length of the anode wires. Preferably, for a coiled configuration, the length of the coiled configuration is about twice the diameter of the turns of the coil.

In particularly preferred embodiments, the magnetic field generator includes pinch coils at the ends of the main coil. These pinch coils, as well as the main coil, can be made of any metal that can be fabricated into a coil, preferably they are made of copper. They can be made of solid or hollow tubing. They can be of any diameter depending on the magnetic field desired. The tubing can be optionally coated with an insulating material to avoid electrical shorting. This is particularly desirable when a closed coil configuration is used. The number of turns per unit length of the main coil is typically governed by the desired magnetic field and the desired degree of openness of the configuration. Typically, it is desirable to minimize the spacing between the turns for maximum magnetic field strength and minimum current requirements, while balancing this against the desire to maximize the spacing between the turns to allow the macroparticles to escape. In preferred arrangements, the main coil is made of 0.95 cm (⅜ inch; outside diameter) hollow copper tubing formed into an open coil configuration having 0.39 turn/cm (1 turn per inch).

The "pinch" coils confine the plasma to a smaller region. Advantageously, these pinch coils provide thicker coatings in shorter times. As stated above, these coils have a cross-sectional diameter that is equal to, or preferably less than, the cross-sectional diameter of the magnetic coil. The pinch coils can be made of the same tubing as that of the main coil, although this is not a requirement. The pinch coils can be electrically and physically separate from the main coil. Alternatively, the main coil and the pinch coils can be made from one piece of tubing with the pinch coils wrapped tighter and into a smaller cross-sectional configuration. The length of the pinch coils is not critical, although they are typically shorter than the length of the main coil.

The magnetic system is connected to a power source, preferably a direct current source, which is distinct from the power source(s) of the anode-cathode system. The current supplied to the magnetic system is preferably about 50–300 Amps, and more preferably about 200–300 Amps. A current of about 50 Amps produces a magnetic field of about 25 Gauss at the cathode evaporation surface, for example, which is about the minimum required for the arc to travel around the circumference of the cathode, and about 50 Gauss at the center of the pinch coils. A current of about 300 Amps produces a magnetic field of about 200 Gauss at the cathode and about 500 Gauss at the center of the pinch coils. Generally, the higher the magnetic field, the smaller the field of deposition, although the higher the rate of deposition. Thus, the magnetic field is chosen to balance the deposition rate with the field of deposition. Preferably, the apparatus is operated at a magnetic field of 100 Gauss at the cathode and 250 Gauss at the center of the pinch coils. To allow for higher magnetic fields, it is advisable to cool at least the main coil with a coolant such as water, for example, by using hollow tubing for the coil and passing the coolant through this tubing.

Referring to FIG. 6, for coating fibers with a metal oxide coating, the apparatus operates in the following manner: pay-out spools 21 containing fibers 19 are placed in the upper chamber 1 and the fibers 19 are directed through the reaction chamber 15 to the take-up spools of fibers in the lower chamber 7 by means for conveying the fibers (not shown). In the reaction chamber 15, the fibers pass through the opening (82 in FIG. 5) of the cathode 16. The chambers are first evacuated to about 100 mTorr, and then using the high vacuum pumps 5 and 11, the chambers are evacuated to about $5 \times 10^{-5}$ Torr. The chambers are then filled with an inert gas, such as argon, and a flow of oxygen is provided at a rate sufficient to consume it during operation and maintain a stable pressure. The oxygen, or any desired process gas, is preferably injected in a path at each end of the deposition space, next to the fibers (or within the billowed filaments of a multifilament tow), to enable metal oxide formation near the fiber surface. An operating voltage is supplied to the anode and to the cathode from the direct current source, whereupon the magnetic system is switched on. Then a starting voltage is supplied to the cathode and the striker and an electric arc is produced between the cathode and the anode. The resultant arc, i.e., cathode spot, rotates on the evaporation surface (84 in FIG. 5) of the cathode under the influence of the magnetic field of the magnetic system. The arc causes evaporation of the material of the cathode and formation of a plasma cloud rotating in a plane perpendicular to the axis of the anode array. As a result, the neutral macroparticles of the plasma stream pass through the openings between the anode wires and the positive ions are deflected from the potential barrier produced by the electric field in the plasma under the influence of the magnetic field and deposit on the surface of the object being coated. Due to the rotation of the plasma cloud, the object is coated throughout the whole periphery thereof.

The fibers that are coated using this preferred process are continuous fibers ranging in length from a few meters to thousands of meters. The selection of fiber length depends on the fiber that is coated, the size of the spool of fiber that the chamber will hold, and therefore, the size of the chamber. The coating run length is then limited by the amount of fiber which can be wound on a spool. The fibers, for example, can be made of alum aluminosilicate, aluminoborosilicate, zirconia-silica, zirconia, titania, carbon, silicon carbide, silicon nitride, glass, and the like. One criterion for selection of the fibers is that they must be able to withstand the temperatures and conditions of the deposition process and the conditions of subsequent processing used in the preparation of metal matrix composites.

Single fibers or multifilament tows of fibers are suitable as substrates in this invention. If multifilament tows are used, the fibers can be spread by electrostatic charging and buffeting by momentum transfer between ions and the tow ("ion wind"), as described in the examples below, to enhance more uniform coating of each individual filament.

Typical monofilaments range in diameter from about 30 micrometers to about 150 micrometers and are available as silicon carbide, carbon, or single crystal alumina. Monofilament single crystal alumina fibers suitable for this invention are available commercially under the trade designation SAPHIKON fibers from Saphikon, Inc. of Milford, N.H. and range in diameter from about 75 micrometers to about 125 micrometers. Monofilament silicon carbide fibers are available from Sigma BP Materials, United Kingdom, from Atlantic Research, Inc., and from Textron Specialty Materials.

Multifilament tows of silicon carbide are available under the trade designation NICALON fibers, (manufactured by Nippon Carbon and available from Dow Corning, Midland, Mich.; reported tensile strength is 400,000 psi) or under the trade designation TYRANNO fibers (manufactured by UBE Industries and available from Textron Specialty Materials in Lowell, Mass.). These fibers range in diameter from about 7 micrometers to about 15 micrometers. Silicon nitride fibers could also be used in this invention.

Oxide ceramic fibers typically are available as continuous tows (also referred to as rovings) or yarns (in which strands of fibers are twisted), which include about 100 to about 1000 individual ceramic oxide fibers. Suitable ceramic fibers for the practice of this invention are oxide fibers available as tows, wherein typically about 100 to 800 fibers are in the tow. The fibers range in diameter from about 5 micrometers to about 20 micrometers. Preferably, the fibers are polycrystalline or amorphous and polycrystalline.

Ceramic oxide fibers are available commercially under the trade designation NEXTEL Ceramic Fibers, from the 3M Co., St. Paul, Minn. For example, NEXTEL 312, 440, 480 Ceramic Fibers are ceramic fibers having varying percentages of the components of aluminoborosilicate ($Al_2O_3$/$B_2O_3$/$SiO_2$). Aluminosilicate fibers are available as NEXTEL 550 Ceramic Fibers. NEXTEL 610 Ceramic Fiber is an alumina fiber. Titania fibers suitable for practice of this invention are taught in Lange U.S. Pat. No. 4,166,147. Zirconia fibers are taught in Funkenbusch U.S. Pat. No. 4,937,212. Fibers comprised of zirconia and silica are disclosed in Sowman U.S. Pat. No. 3,709,706.

Commercially available continuous ceramic fibers typically are treated with sizing during their manufacture. Sizings are organic coatings (such as starch, oil, or wax) which provide lubricity and protect the fiber strand during handling. Sizings generally improve handleability during weaving and handling, and are commonly known in the art. Sizings tend to reduce the breakage of fibers. Typically, it is preferred to remove the sizings by heating at about 300° C. for a time sufficient to remove the sizing on the fibers before depositing a coating via cathodic arc.

The coated fibers are incorporated into a metal or intermetallic matrix by methods known in the art, such as foil-fiber-foil, powder-cloth, plasma spray, and physical vapor deposition. A preferred method is to deposit the matrix by physical vapor deposition such as by electron beam evaporation or sputtering. Once the fibers are positioned in a metal matrix, this "lay-up" is consolidated by hot isostatic pressing.

Hot isostatic pressing (HIPing) is a process wherein the metal consolidates at high temperature, typically 600° C. to 1200° C., and high pressures, typically 10 to 200 MPa, for a time sufficient to get full density, typically from 1 to 10 hrs. HIPing can be done with equipment that is commercially available, for example, with an EAGLE SIX Hot Isostatic Press, from International Pressure Systems of Columbus, Ohio.

Fiber reinforced metal matrix composites are important for applications wherein lightweight, strong, high-temperature-resistant materials are needed. For example, nozzle flaps, airframe structures, and turbine blades in jet engines have in-use temperatures up to 900° C. Metal matrix composites are superior to unreinforced metals in stiffness, strength, fatigue resistance, and wear characteristics. These improvements in metal characteristics are largely a function of the properties of the reinforcing fibers and on the interface between the fibers and the matrix.

Manufacturing routes for incorporating ceramic fibers in metal matrices usually have focused on the use of large diameter (100 micrometers) monofilaments such as boron or silicon carbide. One of the most widely used manufacturing techniques for producing titanium alloy composites has been a "foil-fiber-foil" lay-up. In this technique, unidirectional mats of monofilaments are sandwiched between alternate layers of alloy foil (75 to 100 micrometers thick), before hot pressing. The fiber mat is produced either by weaving the fibers with a wire or ribbon cross-weave, or the fibers are held in place with a fugitive organic binder which is driven off during a degassing stage before hot pressing. Another technique, the "powder-cloth" process, is similar to the "foil-fiber-foil" process, except that a free-standing sheet of alloy and organic binder is used in place of foil. After lay-up, the organic component is driven off by heating in vacuum.

Metal matrix composites can also be produced by winding monofilaments in a powder slurry and fugitive binder. Matrix metal is deposited by plasma spraying or physical vapor deposition and the composite is hot pressed. Typically, a single layer of monofilament is wound side by side on a drum and removed from the drum for coating with metal. The coated fibers are then stacked and hot pressed.

Objects and advantages of this invention are further illustrated by the following examples, but the particular materials and amounts thereof recited in these examples as well as other conditions and details, should not be construed to unduly limit this invention. All materials are commercially available except where stated or otherwise made apparent.

EXPERIMENTAL EXAMPLES

Preparation of Cathodes and Anodes

Yttrium cathodes were machined from solid rods 12.7 cm in diameter by 30.5 cm long. Material suitable for forming a yttrium cathode had a purity of about 99% and was obtained from Rhone Poulenc, Inc., of Phoenix, Ariz. Aluminum (6061 grade) and titanium (commercially pure) cathodes were machined from solid plate stock 2.54 cm thick. The final cathode geometry was 2.5 cm high with a diameter of 12.7 cm and an annular opening 8.9 cm in diameter.

Anode materials such as molybdenum, tantalum, and tungsten are commercially available in grades of suitable purity for use in this invention. Tungsten and molybdenum wires (0.37 cm in diameter) are commercially available from Schwartzkopf Technologies Corp of Holliston, Mass.

Preparation of the Reaction Chamber

The reaction chamber was an aluminum and stainless steel chamber (i.e., an enclosure) approximately 94 cm long and 33 cm square and was equipped with appropriate electrical and vacuum feedthroughs. The chamber contained mounting clamps and holders for a water cooled ring-shaped cathode, multiple anodes at the periphery of the chamber, a striker to initiate the arc, magnetic coils, reels of fiber positioned to feed through the cathode, and take-up reels. The magnetic coils served to confine the plasma in the deposition space.

The deposition space was approximately 76.2 cm long; the main coil length was 66 cm and 25.4 cm in diameter. Pinch coils, made from tightly wound 0.63 cm diameter insulated copper tubing (to final dimensions of approximately 5.1 cm wide, 16.5 cm inner diameter and 19 cm outer diameter) served to control the shape of the magnetic field, forming a magnetic bottle.

A ring-shaped cathode was mounted with two current and coolant supplying clamps at the center of the deposition space. The cathode was slotted, i.e., crenelated, into 7 faces with slot dimensions approximately 0.089–0.13 cm wide and about 0.76 cm deep. Boron nitride insulators (1.25 cm thick annular rings machined from a 12.7 cm by 30.5 cm sheet of boron nitride, commercially available from Carborundum Co. of Worcestor, Mass.) were positioned at each side of the cathode with a 0.13 cm gap at the cathode edge. The insulators were used to prevent arc spot migration to the cathode hardware surfaces. The cathode was sealed via o-rings as an assembly and chilled water was circulated through the assembly. The cathode current tubes were insulated against arc spot migration by wrapping with ceramic fabric sleeving (NEXTEL 312 ceramic oxide sleeving, commercially available from 3M Co. of St. Paul, Minn.) around the tubes. The cathode assembly was attached at the current tubes to the reactor door by means of o-ring seals.

The cathode was surrounded by 8 anode wires (tungsten), equally spaced around a 21.6-cm diameter periphery (cathode to anode distance was 4.4 cm). The wires were approximately 0.37 cm in diameter and 62 cm long. The wires were loosely clamped at top and bottom to allow for thermal expansion when heating.

The main magnetic coil surrounded the anode wire array. This coil was fabricated from copper tubing of 0.95 cm diameter and had a coil spacing of 1 turn per inch (0.4 turn/cm). It was 25.4 cm on center diameter and 66 cm long.

The striker was a 0.25 cm diameter molybdenum wire. One end of the wire was positioned approximately 2.5 cm from the center of the cathode surface. The actuating mechanism was a 2.5 cm stroke, bellows sealed, linear motion air actuated feedthrough.

The upper chamber contained a ten position fiber pay-out assembly; ten spools of fiber were positioned on this and were threaded onto a roller guide comb and fed through the cathode. Each fiber was fed onto a separate take-up assembly at the bottom of the chamber. The pay-out and take-up spools were driven by a belt drive which fed the fibers through the chamber at a rate of 0.15 meters/minute. The take-up reel was driven so that the fibers were level wound.

After the fibers were in place, the system was dosed and clamped tight onto o-ring seals. Vacuum pumps were used to reduce the pressure to 100 millitorr. At 100 millitorr, the roughing valves were closed and diffusion pumps were used to obtain a high vacuum (to about $5 \times 10^{-5}$ torr).

Process gases were admitted. Argon was added first to give an operating pressure of 1.5 millitorr. Oxygen was then added (55 sccm was provided for the proper $Y_2O_3$ stoichiometry during yttrium metal evaporation).

The magnetic system was energized after admission of the process gas. 200 Amps (D.C.) provides 100 Gauss at the cathode face and 250 Gauss at the pinch coils. The cathode and the anode wires were then energized to 150 to 200 Amps (D.C.).

The striker was then actuated, momentarily energizing the striker with an anode potential through a 3 ohm resistor. The arc ignited when the striker contacted the cathode. The arc rapidly moved over the surface of the cathode and jumped across the crenelated cathode face surfaces, providing uniform cathode erosion.

Preparation of Yttria Coated Alumina Fibers

Using the method and apparatus described above, monofilament single crystal alumina fibers (commercially available under the trade designation "SAPHIKON" from Saphikon, Inc. of Milford, N.H.) were coated with yttria (yttrium oxide). The yttrium cathode was formed in the shape of an annular ring of 12.7 cm outer diameter and 8.9 cm inner diameter. The cathode was crenelated as described above. The cathode was surrounded by 8 tungsten anode wires as described above. The yttrium cathode was supplied with 160 Amps. The magnetic system was energized with 200 Amps, which provided approximately 100 Gauss at the cathode face and 250 Gauss at the pinch coils. The chamber pressure was 1.5 mTorr. As described above, 9 monofilament single crystal alumina fibers ("SAPHIKON") were advanced through the metal ion reactor (thus through the center of the cathode) at a rate of about 15.2 cm/min and coated with yttria. The run time was 3 hours and 41 minutes.

The composition of the coating was determined by energy dispersive x-ray analysis to be yttria. The coating was about 1.04 micrometers thick. Examination of cross-sections of the coated fibers showed that the coating was dense (i.e., free of columnar microstructure). Examination of the surface of the coating along the length of the fiber revealed a small number of perfectly spherical macroparticles ranging in size from approximately 530 to 1400 nanometers. Examination of a micrograph (at magnification 1500×) of a section of the fiber gave a rough estimate of the size and frequency of macroparticles present. There was estimated to be 1 macroparticle per 369 square micrometers over the sample length examined. The sphericity of the particles indicated that these particles were deflected back onto the fibers from the chamber walls or from the anode wires. A "line-of-sight" particle, by contrast, has the appearance of a droplet or splat.

Preparation of Yttria Coated Silicon Carbide Fibers

Using the method and apparatus described above, monofilament silicon carbide fibers (commercially available under the trade designation "1040 SIGMA" from Sigma BP Materials of the United Kingdom) were coated with yttria (yttrium oxide). The yttrium cathode was formed in the shape of an annular ring of 12.7 cm outer diameter and 8.9 cm inner diameter. The cathode was crenelated as described above. The cathode was surrounded by 8 tungsten anode wires. The yttrium cathode was supplied with 170 Amps. The magnetic system was energized with 200 Amps, which provided approximately 100 Gauss at the cathode face and 250 Gauss at the pinch coils. The chamber pressure was 1.5 mTorr. Nine fibers ("1040 SIGMA") were advanced through the metal ion reactor (thus through the center of the cathodes) at a rate of about 10.2 cm/min and coated with yttria. The run time was 30 minutes.

The composition of the coating was determined by energy dispersive x-ray analysis to be yttria. The coating was about 1.6 micrometers thick. Examination of cross-sections of the coated fibers showed that the coating was dense (i.e., free of columnar microstructure). Examination of the surface of the coating along the length of the fiber revealed a small number of perfectly spherical macroparticles ranging in size from 530 to 1400 nanometers. Examination of a micrograph (at magnification 1500×) of a section of the fiber gave a rough estimate of the size and frequency of macroparticles present. There was estimated to be 1 macroparticle per 369 square micrometers over the sample length examined.

Preparation of a Mixed Oxide (Al—Y) Coating on Alumina Fibers

To prepare a mixed oxide coating of alumina and yttria, the apparatus described above (and as shown in FIG. 3) was modified by installing two cathodes, one of aluminum and one of yttrium, each of dimension 2.5 cm thick, and each in the shape of an annular ring of 12.7 cm outer diameter and 8.9 cm inner diameter. The cathodes were not crenelated. The cathodes were independently powered. The cathodes were axially aligned (along the axis depicted in FIG. 5). The distance between the facing surfaces of the cathodes was 2.5 cm. An eight-wire tungsten anode array served as anode to both cathodes. The aluminum cathode was supplied with 150 Amps and the yttrium cathode with 90 Amps. The magnetic system was energized with 200 Amps, which provided approximately 100 Gauss at the cathode face and 250 Gauss at the pinch coils. As described in the procedure above, nine monofilament single crystal alumina fibers ("SAPHIKON") were advanced through the metal ion reactor (thus through the center of the cathodes) at a rate of about 15.2 cm/min and coated with a mixture of alumina and yttria. The run time was 3 hours and 38 minutes. The chamber pressure was 2.4 mTorr.

The composition of the coating was determined by ENERGY DISPERSIVE X-RAY ANALYSIS to be 65% alumina and 35% yttria. The coating was about 680 nanometers thick. Examination of cross-sections of the coated fibers showed that the coating was dense (i.e., free of columnar microstructure). Examination of SEM micrographs at a magnification of 1500× of coated fiber revealed perfectly spherical macroparticles ranging in size from 285 to 1880 nanometers. Them was about 1 macroparticle per 25 square micrometers.

Preparation of a Mixed Oxide (Zr—Y) Coating on Alumina Fibers

To prepare a mixed oxide coating of zirconia and yttria, the apparatus described above (and as shown in FIG. 3) was modified by installing two cathodes, one of zirconium (commercially available in 2.5 cm thick plate from Teledyne of Huntsville, Ala.) and one of yttrium. Each cathode was formed into an annular ring of 12.7 cm outer diameter and 8.9 cm inner diameter and 2.5 cm thick but was not crenelated. The cathodes were independently powered. The cathodes were axially aligned (along the axis depicted in FIG. 5). The distance between the facing surfaces of the cathodes was 2.5 cm. An eight wire tungsten anode array served as anode to both cathodes. The zirconium cathode was supplied with 220 Amps and the yttrium cathode with 80 Amps. The magnetic system was energized with 250 Amps, which provided approximately 125 Gauss at the cathode face and 317 Gauss at the pinch coils. The chamber pressure was 2.4 mTorr. As described above, nine monofilament single crystal alumina fibers ("SAPHIKON") were advanced through the metal ion reactor at a rate of about 15.2 cm/min and coated with a mixture of zirconia and yttria.

The composition of the coating was determined by ENERGY DISPERSIVE X-RAY ANALYSIS to be approximately 80% zirconia and 20% yttria. The coating was about 900 nanometers thick. Examination of cross-sections of the coated fibers showed that the coating was dense (i.e., free of columnar microstructure). Examination of SEM micrographs at a magnification of 1500× of coated fiber revealed a small number of perfectly spherical macroparticles ranging in size from 480 to 1080 nanometers. There was about 1 macroparticle per every 464 square micrometers.

Preparation of a Mixed Oxide (Al—Y) Coating on Silicon Carbide Fibers

To prepare a mixed oxide coating of alumina and yttria, the apparatus described above (and as shown in FIG. 3) was modified by installing two cathodes, one of aluminum and one of yttrium. Each cathode was formed into an annular ring, 2.5 cm thick, 12.7 cm outer diameter and 8.9 cm inner diameter. The cathodes were axially aligned (along the axis depicted in FIG. 5). The cathodes were independently powered and separated by a 1.25 cm thick boron nitride spacer. An eight-wire tungsten anode array served as anode to both cathodes. The aluminum cathode was supplied with 100 Amps and the yttrium cathode with 60 Amps. The magnetic system was energized with 200 Amps, which provided approximately 100 Gauss at the cathode face and 250 Gauss at the pinch coils. The chamber pressure was 4.6 mTorr. As described in the procedure above, nine monofilament silicon carbide fibers ("1040 SIGMA") were advanced through the metal ion reactor (thus through the center of the cathodes) at a rate of about 10.2 cm/min and coated with a mixture of alumina and yttria. The run time was 16 minutes.

The composition of the coating was determined by ENERGY DISPERSIVE X-RAY ANALYSIS to be 65% alumina and 35% yttria. The coating was about 1.35 micrometers thick. Examination of cross-sections of the coated fibers showed that the coating was dense (i.e., free of columnar microstructure). Examination of SEM micrographs at a magnification of 1500× of the coated fiber revealed perfectly spherical macroparticles ranging in size from 303 to 1229 nanometers. There was about 1 macroparticle per 65 square micrometers.

Preparation of a Niobium, Yttria, Yttrium Multilayerd Coating on Alumina Multifilament Tows Multifilament tows of alumina fibers (commercially available under the trade designation "NEXTEL 610" from the 3M Company of St. Paul, Minn.) were coated with niobium, yttria, and yttrium sequentially in the reactor depicted in FIG. 2. The yttrium and niobium cathodes were 1.9 cm thick and 7.62 cm diameter with a 1.25 cm diameter center bore.

To prepare fibers for coating, 20 sections of tow (each having 120 fibers, and each about 18 cm long) first were affixed using adhesive tape to a 5 cm diameter disc. The fibers in the tows were spread out and separated by brushing them with a small brush. This brushing action produced an electrostatic charge in the fibers which aided in separating them. Once separated and unentangled, the unaffixed ends of the fibers were taped down to an opposing disc and held in place. The discs were held 18 cm apart by an internal support rod.

To coat the fibers, the fixture loaded with fibers was moved into position parallel to and 5 cm away from the cathode surface, then the chamber was pumped down and backfilled with argon. The cathode was surrounded by 16 anode wires (0.10 inch diameter molybdenum wires). For each coating, the magnetic system was energized with 10 Amps, which provided approximately 85 Gauss at the cathode face. The niobium cathode was supplied with 100 Amps at a chamber pressure of 4.7 mTorr. Niobium was deposited for 6 minutes and gave a coating 250 nanometers thick. The chamber was opened to change cathodes. The yttrium cathode was installed, then the chamber was pumped down and backfilled with argon. The yttrium cathode was supplied with 60 Amps at a chamber pressure of 3.4 mTorr. To deposit yttria, oxygen was admitted to the chamber. Yttria was deposited for 6 minutes and produced a coating 500 nanometers thick. To deposit yttrium, the flow of oxygen was stopped, the yttrium cathode again was supplied with 60

Amps at a chamber pressure of 3.4 mTorr. The coating process continued for 4 minutes, producing a yttrium coating 250 nanometers thick. All of the fibers in the tows appeared to be coated.

The entire disclosures of all patents, patent documents, and publications cited herein are incorporated by reference as if each were individually incorporated. While particular embodiments of the invention have been shown and described, various modifications thereof will be apparent to those skilled in the art. Therefore, it is not intended that the invention be limited to the disclosed embodiments or to the details thereof. Departures may be made therefrom within the spirit and scope of the invention as defined in the claims.

What is claimed is:

1. A cathodic arc coating apparatus for applying a coating to an object, comprising:
   (a) an enclosure;
   (b) means for evacuating the enclosure;
   (c) an anode within the enclosure, wherein the anode comprises an open array of metal members defining a central axis and a deposition space for positioning the object;
   (d) a cathode assembly positioned within the deposition space, wherein the cathode assembly comprises a first consumable cathode having a central axis and an evaporation surface;
   (e) means for generating a plasma stream comprising charged particles, wherein the plasma stream is projected from the evaporation surface of the first consumable cathode toward the anode array; and
   (f) a magnetic system for diverting the charged particles of the plasma stream away from the anode array and toward the object being coated;
   whereby the diverted charged particles are deposited on the object to form a coating thereon.

2. The apparatus of claim 1 further including means for heating the anode array to attenuate the accumulation of material from the plasma stream on the anode array.

3. The apparatus of claim 1 further including means for conveying the object parallel to the central axis of the cathode through the deposition space so as to progressively coat the exterior of the object.

4. The apparatus of claim 1 wherein the central axes of the anode array and the first consumable cathode are operationally aligned such that the evaporation surface of the first consumable cathode is outwardly facing.

5. The apparatus of claim 4 wherein the evaporation surface of the first consumable cathode comprises a crenelated surface.

6. The apparatus of claim 4 wherein the first consumable cathode is ring-shaped and has a top surface and a bottom surface.

7. The apparatus of claim 6 wherein the the first ring-shaped consumable cathode is positioned in the anode array in a coaxial relationship.

8. The apparatus of claim 7 wherein the evaporation surface of the first ring-shaped consumable cathode comprises a concentric circumferentially crenelated surface.

9. The apparatus of claim 6 wherein the object comprises a fiber and the apparatus further includes means for conveying a fiber parallel to the central axis of the cathode through the deposition space, so as to progressively coat the exterior of the object.

10. The apparatus of claim 6 wherein the cathode assembly further includes a second ring-shaped consumable cathode positioned in a coaxial relationship with the first ring-shaped consumable cathode and axially spaced therefrom.

11. The apparatus of claim 10 wherein the first and second cathodes are connected to one power source, which is connected to the anode.

12. The apparatus of claim 10 wherein the first and second cathodes are each connected to a separate power source, both of which are connected to the anode.

13. The apparatus of claim 10 wherein the first ring-shaped consumable cathode comprises a first metal and the second ring-shaped consumable cathode comprises a second metal, wherein the first and second metals are different.

14. The apparatus of claim 13 wherein the metals of the consumable cathodes are selected from the group consisting of molybdenum, tantalum, tungsten, niobium, aluminum, yttrium, zirconium, hafnium, gadolinium, titanium, erbium, copper, and chromium.

15. The apparatus of claim 6 wherein the first ring-shaped consumable cathode comprises at least two different metals.

16. The apparatus of claim 6 wherein the first ring-shaped consumable cathode comprises a metal selected from the group consisting of molybdenum, tantalum, tungsten, niobium, aluminum, yttrium, zirconium, hafnium, gadolinium, titanium, erbium, copper, and chromium.

17. The apparatus of claim 6 wherein the first ring-shaped consumable cathode further includes an insulating material on the top and bottom surfaces.

18. The apparatus of claim 17 wherein the insulating material comprises boron nitride.

19. The apparatus of claim 1 further including means for injecting a process gas into the deposition space.

20. The apparatus of claim 1 wherein the cathode assembly comprises multiple axially spaced ring-shaped cathodes each with a central axis positioned in a coaxial relationship.

21. The apparatus of claim 1 wherein the means for generating a plasma comprises:
   (a) a striker for starting an arc discharge and a plasma; wherein the striker is electrically connected to the anode array and positioned adjacent to the first consumable cathode; and
   (b) a direct current source for feeding electrical power to sustain the arc on the cathode evaporation surface and the plasma between the anode array and the first consumable cathode, the direct current source being connected to the anode array and the first consumable cathode.

22. The apparatus of claim 1 further including means for cooling the first consumable cathode.

23. The apparatus of claim 1 wherein the anode comprises an open array of concentrically arranged metal wires.

24. The apparatus of claim 23 further including an anode array support system comprising slip connectors, wherein the anode wires are supported at a first end and slidingly engaged with the slip connectors at a second end.

25. The apparatus of claim 24 wherein the anode wires are upright.

26. The apparatus of claim 24 further including means for cooling the anode array support system.

27. The apparatus of claim 24 further including means for heating the anode array to attenuate the accumulation of material from the plasma stream on the anode array.

28. The apparatus of claim 27 wherein the means for heating the anode array comprises means for resistively heating the array to a temperature of about 800°–1200° C.

29. The apparatus of claim 24 wherein the anode array comprises metal wires selected from the group consisting of tungsten, molybdenum, tantalum, niobium, rhenium, iridium, osmium, and ruthenium.

30. The apparatus of claim 29 wherein the anode array comprises tungsten wires.

31. The apparatus of claim 24 wherein the metal wires occupy less than about 50% of the projected area of the anode array.

32. The apparatus of claim 31 wherein the metal wires occupy less than about 5% of the projected area of the anode array.

33. The apparatus of claim 1 wherein the magnetic system comprises a magnetic field generator, a power source, and a magnetic field generated by the power source and magnetic field generator, wherein the magnetic field comprises lines of flux extending into the deposition space.

34. The apparatus of claim 33 wherein the anode comprises an open array of concentrically arranged metal wires aligned in a nonintersecting fashion with the lines of flux.

35. The apparatus of claim 33 wherein the magnetic field generator comprises a solenoid.

36. The apparatus of claim 35 wherein the solenoid comprises a main coil in an open configuration.

37. The apparatus of claim 36 wherein the magnetic field generator includes pinch coils at the ends of the main coil.

38. The apparatus of claim 35 wherein the solenoid comprises a main coil in a closed configuration.

39. The apparatus of claim 38 wherein the magnetic field generator includes pinch coils at the ends of the main coil.

40. The apparatus of claim 33 wherein the .magnetic field generator is inside the enclosure.

41. The apparatus of claim 33 wherein the enclosure is nonmagnetic and the magnetic field generator is outside the enclosure.

42. The apparatus of claim 33 wherein the magnetic field generator is the enclosure.

43. The apparatus of claim 33 further including means for cooling the magnetic field generator.

44. A cathodic arc coating apparatus for applying a coating to an object, comprising:
(a) an enclosure;
(b) means for evacuating the enclosure;
(c) an anode within the enclosure, wherein the anode comprises an open array of a concentrically arranged metal wires defining a central axis and a deposition space for positioning the object;
(d) a cathode assembly positioned within the deposition space, wherein:
(i) the cathode assembly comprises a first ring-shaped consumable cathode having a central axis, a top surface, a bottom surface, and a circumferential evaporation surface; and
(ii) the central axes of the anode array and the first consumable cathode are coaxially aligned such that the evaporation surface of the first consumable cathode is outwardly facing with respect to its central axis;
(e) means for generating a plasma stream comprising charged particles, wherein the plasma stream is projected from the evaporation surface of the first consumable cathode toward the anode array; and
(f) a magnetic system for diverting the charged particles of the plasma stream away from the anode array and toward the object being coated; wherein the magnetic system comprises a magnetic field generator, a power source, and a magnetic field comprising lines of flux extending into the deposition space generated by the power source and magnetic field generator;
whereby the diverted charged particles are deposited on the object to form a coating thereon.

45. The apparatus of claim 44 further including means for heating the anode array to attenuate the accumulation of material from the plasma stream on the anode array.

46. The apparatus of claim 44 wherein the evaporation surface of the first ring-shaped consumable cathode comprises a crenelated evaporation surface.

47. The apparatus of claim 44 wherein the anode comprises an open array of concentrically-arranged metal wires aligned in a nonintersecting fashion with the lines of flux.

48. The apparatus of claim 44 further including an anode array support system comprising slip connectors, wherein the anode wires are supported at a first end and slidingly engaged with the slip connectors at a second end.

49. The apparatus of claim 44 wherein the magnetic field generator comprises a main coil and pinch coils at the ends of the main coil.

50. A method for coating fibers, comprising:
(a) providing a cathodic arc coating apparatus comprising:
(i) an enclosure;
(ii) means for evacuating the enclosure;
(iii) an anode within the enclosure, wherein the anode comprises an open array of metal members defining a central axis and a deposition space for positioning the object;
(iv) a cathode assembly positioned within the deposition space, wherein the cathode assembly comprises a first consumable cathode having a central axis and an evaporation surface;
(v) means for generating a plasma stream comprising charged particles; and
(vi) a magnetic system;
(b) heating the anode array;
(c) generating a plasma stream comprising charged particles and directing it from the evaporation surface of the first consumable cathode toward the anode array;
(d) generating a magnetic field for diverting the charged particles of the plasma stream away from the anode array and toward the object being coated;
(e) contacting the fibers with the diverted charged particles to form a coating thereon; and
(f) advancing fibers through the central opening of the cathode and parallel to its central axis to progressively coat the fibers.

51. The method of claim 50 further including a step of providing a process gas into the deposition space.

52. The method of claim 51 wherein the process gas is oxygen.

53. A cathodic arc coating apparatus for applying a coating to an object, comprising:
(a) an enclosure;
(b) means for evacuating the enclosure;
(c) an anode, wherein the anode has a central axis and defines a deposition space for positioning the object;
(d) a cathode assembly positioned within the deposition space, wherein the cathode assembly comprises a first ring-shaped consumable cathode having a central axis, a top surface, a bottom surface, and a circumferentially crenelated evaporation surface;
(e) means for generating a plasma stream comprising charged particles, wherein the plasma stream is projected from the evaporation surface of the first consumable cathode toward the anode array; and
(f) a magnetic system for diverting the charged particles of the plasma stream away from the anode array and toward the object being coated;
whereby the diverted charged particles are deposited on the object to form a coating thereon.

54. The apparatus of claim 53 wherein the anode is the enclosure.

55. The apparatus of claim 53 further including means for conveying the object parallel to the central axis of the cathode through the deposition space so as to progressively coat the exterior of the object.

56. The apparatus of claim 55 wherein the object is a fiber and the means for conveying the object comprises means for conveying the fiber.

57. The apparatus of claim 53 wherein the central axes of the anode and the first consumable cathode are operationally aligned such that the evaporation surface of the first consumable cathode is outwardly facing.

58. The apparatus of claim 57 wherein the first ring-shaped consumable cathode is positioned in the anode array in a coaxial relationship.

59. The apparatus of claim 58 wherein the cathode assembly further includes a second ring-shaped consumable cathode positioned in a coaxial relationship with the first ring-shaped consumable cathode and axially spaced therefrom.

60. The apparatus of claim 59 wherein the first and second cathodes are connected to one power source.

61. The apparatus of claim 59 wherein the first ring-shaped consumable cathode comprises a first metal and the second ring-shaped consumable cathode comprises a second metal, wherein the first and second metals are different.

62. The apparatus of claim 53 further including means for injecting a process gas into the deposition space.

63. The apparatus of claim 53 wherein the first ring-shaped consumable cathode comprises at least two different metals.

64. The apparatus of claim 63 wherein the metals of the first ring-shaped consumable cathode are selected from the group consisting of molybdenum, tantalum, tungsten, niobium, aluminum, yttrium, zirconium, hafnium, gadolinium, titanium, erbium, copper, and chromium.

65. The apparatus of claim 53 wherein the first ring-shaped consumable cathode further includes an insulating material on the top and bottom surfaces.

66. The apparatus of claim 65 wherein the insulating material comprises boron nitride.

67. The apparatus of claim 53 further including means for cooling the first consumable cathode.

68. A cathodic arc coating apparatus for applying a coating to an object, comprising:
(a) an enclosure;
(b) means for evacuating the enclosure;
(c) an anode, wherein the anode has a central axis and defines a deposition space for positioning the object;
(d) a cathode assembly positioned within the deposition space, wherein the cathode assembly comprises a first consumable cathode having a central axis and an evaporation surface;
(e) means for generating a plasma stream comprising charged particles, wherein the plasma stream is projected from the evaporation surface of the first consumable cathode toward the anode; and
(f) a magnetic system for diverting the charged particles of the plasma stream away from the anode and toward the object being coated; wherein the magnetic system comprises a magnetic field generator comprising a main coil and pinch coils for generating a magnetic field comprising lines of flux extending into the deposition space;

whereby the diverted charged particles are deposited on the object to form a coating thereon.

69. The apparatus of claim 68 wherein the anode comprises an open array of concentrically arranged metal wires aligned in a nonintersecting fashion with the lines of flux.

70. The apparatus of claim 68 wherein the magnetic field generator comprises a main coil in an open configuration.

71. The apparatus of claim 68 wherein the magnetic field generator comprises a main coil in a closed configuration.

72. The apparatus of claim 68 wherein the magnetic field generator is inside the enclosure.

73. The apparatus of claim 68 wherein the enclosure is nonmagnetic and the magnetic field generator is outside the enclosure.

74. The apparatus of claim 68 wherein the magnetic field generator is the enclosure.

75. The apparatus of claim 68 further including means for cooling the magnetic field generator.

* * * * *

UNITED STATES PATENT AND TRADEMARK OFFICE
CERTIFICATE OF CORRECTION

Page 1 of 2

PATENT NO. : 5,518,597
DATED : May 21, 1996
INVENTOR(S) : Jonathan G. Storer, Martin H. Benson, and Robert R. Kieschke It is certified that error appears in the above-indentified patent and that said Letters Patent is hereby corrected as shown below:

Title page, item [56],
<u>Under Other Publications</u> - delete "23435" from the page number for the Sanders reference and insert --2345--

Col. 1, line 26, after "cathodic" delete "are" and insert --arc--.

Col. 1, line 28, after "cathodic" delete "are" and insert --arc--.

Col. 1, line 28, delete "an are" and insert --an arc--.

Col. 5, line 45, delete "dose" and insert --close--.

Col. 8, line 14, after "or deforming" insert --,--.

Col. 10, line 40, after "to prevent", delete "are" and insert --arc--.

Col. 10, line 60, delete "dosed" and insert --closed--.

Col. 12, line 40, after "made of", delete "alum" and insert --alumina--.

Col. 15, line 10, after "to prevent", delete "are" and insert --arc--.

UNITED STATES PATENT AND TRADEMARK OFFICE
CERTIFICATE OF CORRECTION

PATENT NO. : 5,518,597
DATED : May 21, 1996
INVENTOR(S) : Jonathan G. Storer, Martin H. Benson, and Robert R. Kieschke It is certified that error appears in the above-indentified patent and that said Letters Patent is hereby corrected as shown below:

Col. 15, line 14, after "against", delete "are" and insert --arc--.

Col. 15, line 43, delete "dosed" and insert --closed--.

Col. 20, line 34, after "starting an", delete "are" and insert --arc--.

Col. 21, line 24, after "wherein the" delete --,--.

Signed and Sealed this

Twenty-sixth Day of November 1996

Attest:

BRUCE LEHMAN

Attesting Officer     Commissioner of Patents and Trademarks